United States Patent
Martin et al.

(10) Patent No.: US 9,118,300 B2
(45) Date of Patent: Aug. 25, 2015

(54) SAW DEVICE WITH HEAT EFFICIENT TEMPERATURE CONTROLLER

(71) Applicant: Phonon Corporation, Simsbury, CT (US)

(72) Inventors: Tom A. Martin, Canton, CT (US); Pierre A. Dufilie, Vernon, CT (US)

(73) Assignee: Phonon Corporation, Simsbury, CT (US)

( * ) Notice: Subject to any disclaimer, the term of this patent is extended or adjusted under 35 U.S.C. 154(b) by 174 days.

(21) Appl. No.: 13/741,485

(22) Filed: Jan. 15, 2013

(65) Prior Publication Data
US 2014/0197714 A1      Jul. 17, 2014

(51) Int. Cl.
*H05B 1/02*      (2006.01)
*H03H 9/25*      (2006.01)
*H03H 9/02*      (2006.01)

(52) U.S. Cl.
CPC ............ *H03H 9/25* (2013.01); *H03H 9/02834* (2013.01)

(58) Field of Classification Search
CPC . H03H 9/25; H03H 9/02834; H03H 9/02448; H05B 3/0233; H05B 3/023; H05B 3/26; H05B 2203/003; H05B 2203/007; H05B 2203/013; H05B 2203/035
USPC ........... 219/499, 209, 210, 497, 501; 310/343
See application file for complete search history.

(56) References Cited

U.S. PATENT DOCUMENTS

| | | | | |
|---|---|---|---|---|
| 4,726,225 A * | 2/1988 | Brace et al. | ........... | 73/204.23 |
| 5,323,062 A * | 6/1994 | Crawford et al. | ........... | 307/125 |
| 6,100,510 A * | 8/2000 | Chen et al. | ........... | 219/497 |
| 7,514,852 B2 * | 4/2009 | Kasahara et al. | ........... | 310/343 |
| 8,653,420 B2 * | 2/2014 | Arai | ........... | 219/210 |
| 8,779,337 B2 * | 7/2014 | Nakano et al. | ........... | 219/483 |
| 2005/0000281 A1 * | 1/2005 | Konzelmann et al. | ........... | 73/204.15 |
| 2007/0052327 A1 * | 3/2007 | Vilander | ........... | 310/343 |

* cited by examiner

*Primary Examiner* — Mark Paschall
(74) *Attorney, Agent, or Firm* — Alix, Yale & Ristas, LLP

(57) ABSTRACT

A surface acoustic wave (SAW) device comprising at least one heating element formed on the substrate; at least one temperature sensor having a first electric component on the substrate whose resistance varies with the temperature of the substrate and a second electric component whose resistance does not vary; and a temperature controller including an operational amplifier bonded in thermally conductive relationship to the substrate. The operational amplifier is responsive to the output of the temperature sensor to apply power to the heating element and thereby maintain the temperature of the substrate within a predetermined temperature range. The transducer, heating element, and first component are monolithically formed on the substrate, and only three electrical connections are on the substrate at voltage to off-SAW die points.

15 Claims, 6 Drawing Sheets

US 9,118,300 B2

SAW DEVICE WITH HEAT EFFICIENT TEMPERATURE CONTROLLER

BACKGROUND

The present invention relates to temperature compensated surface acoustic wave (SAW) devices.

SAW devices utilize the localized propagation of acoustic waves on the surface of a planar piezoelectric substrate. SAW transduction between electrical signals and acoustic waves is accomplished by thin film metallic interdigital electrodes on the substrate surface. SAW propagation velocity is temperature sensitive, but SAW devices must often work over a wide temperature range, so devices may be mounted in a custom oven to maintain a fixed temperature above the maximum ambient temperature.

An oven comprises a device holder, heater, temperature sensor, feedback temperature controller such as operational amplifier, thermal insulation, and electrical connections between the device and ambient. An oven contains (and is thus larger than) the ovenized device and consumes significant power.

One example of an attempt to provide more efficient temperature compensation for a SAW device, is described in U.S. Publication 2008/0055022A1. The SAW substrate is contained within a vacuum housing which in turn is within a packaging, and a heater is located on the housing or the bottom of the SAW substrate, opposite the acoustic propagation surface. Although a distinct oven around the packaging is avoided, the heater is still remote from the propagation surface of the SAW substrate.

Pending U.S. application Ser. No. 13/065,177 for "Monolithically Applied Heating Elements on SAW Substrate" discloses a "micro-oven" technique for heating and preferably temperature sensing only the localized surface where the surface acoustic waves actually exist. The heater and preferably associated temperature sensor are realized as thin film metallic meander resistor electrodes on the substrate propagation surface, which can be deposited monolithically with the transducers and other functional features from the same photomask and photolithographic manufacturing process. One embodiment is directed to a surface SAW device comprising a substrate having a working surface with an active zone capable of propagating an acoustic wave, at least one interdigital transducer on the working surface, and a heating element on the working surface, adjacent to at least the active zone, wherein the transducer and heating element have the same material composition.

Although this monolithic heating system represents a major improvement over previous systems, a significant amount of heat generated by the system is not applied to the SAW surface due to connection losses.

SUMMARY

The present invention is directed to a further improvement in the temperature control of SAW devices.

Although operational amplifiers are often used as part of the temperature controller, we have discovered a novel way of configuring the inputs to a commercially available operational amplifier for simpler and more accurate control.

The invention is preferably used in conjunction with heating and sensing elements realized as thin film metallic meander resistor electrodes on the substrate propagation surface. Ideally, the goal is to improve the micro-oven control circuitry by (1) minimizing the number wire bonds to off-SAW die points in order to reduce total thermal loss from the SAW die; (2) keeping all power dissipating components on the SAW-die so that they heat the SAW die and thereby minimize total micro-oven power; and (3) minimizing off-mask component count to reduce complexity and cost, and allow the control circuitry to be incorporated compactly entirely inside the SAW device package.

The circuit is a basic servo loop which strives to zero the bridge voltage across the operational amplifier input terminals. Conventionally, the temperature varying sensor resistors are incorporated in the SAW mask, while the other three resistors in the bridge circuit are fixed external resistors. With the present invention, the functions of the resistors are switched. The three other resistors of the bridge circuit are now temperature variable, incorporated in the SAW mask, and built of the same thin metal film as the rest of the SAW device. The set point resistor is now an off-mask temperature invariant resistor, either bonded to the SAW substrate or mounted externally so that the set-point temperature may be controlled by the user. Preferably, the operational amplifier is also directly carried on the SAW substrate so that its dissipation energy further heats the substrate.

With the preferred embodiment, only three wire bonds are required from the SAW substrate and amplifier to realize the micro-oven control circuit, even with an external set point resistor. These three wire bonds are for the source or bias voltage, the set point resistor, and reference voltage (e.g., ground).

DETAILED DESCRIPTION

Figure 1:
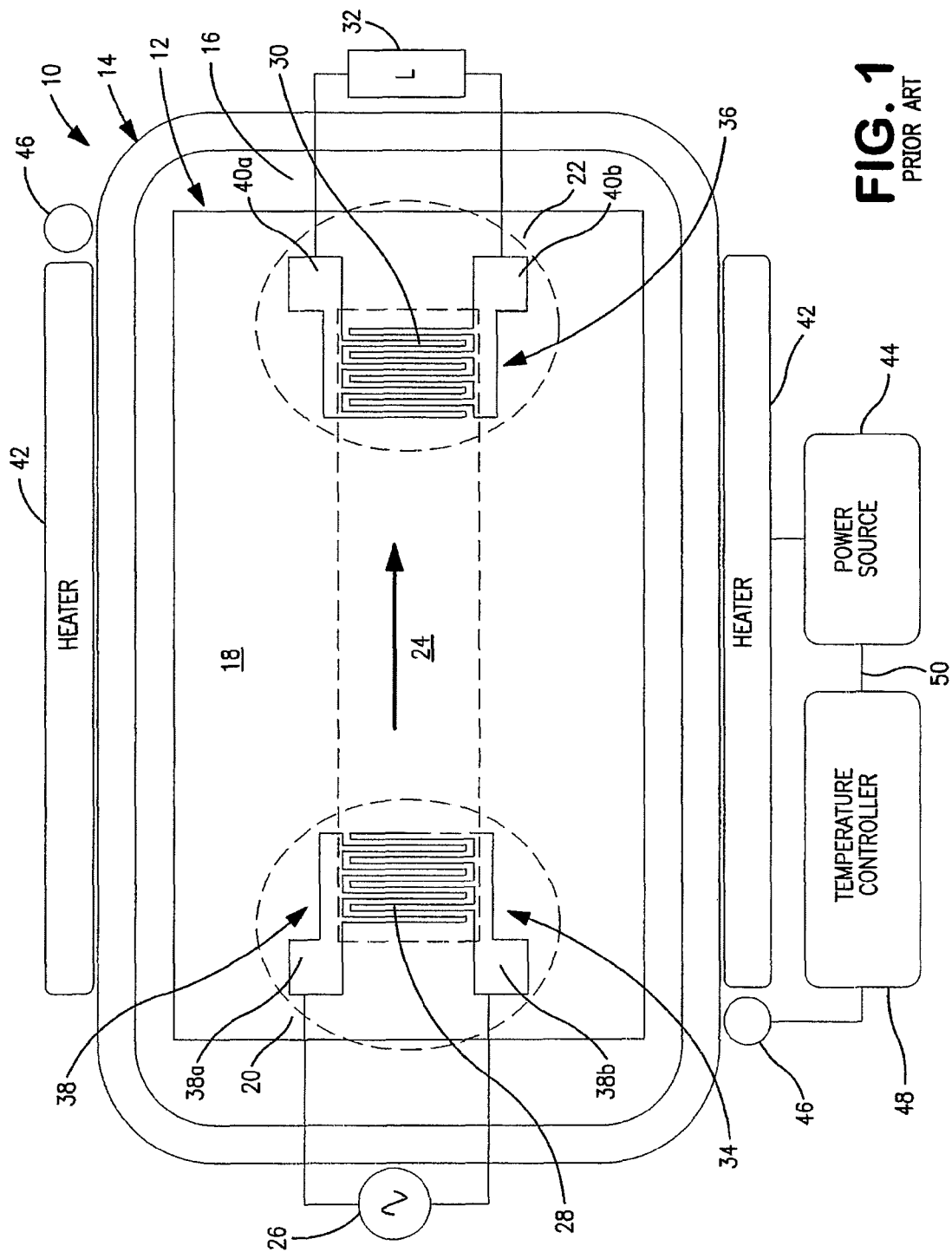
FIG. 1 is a schematic of a conventional SAW band pass filter in a case with external heaters and temperature control.

FIG. 1 represents a conventional band pass SAW filter 10 comprising a piezo electric crystal substrate 12 encapsulated by casing 14 with intervening air gap 16. The working surface 18 of the substrate is capable of transmitting acoustic surface waves, which are induced by input electric-to-mechanical transducer 20 and received by output mechanical-to-electric transducer 22. The transducers 20, 22 are aligned with an axis of the crystalline structure of substrate 12, such that the transducer waveforms travel along such axis on an active zone 24 of the working surface 18.

A source 26 of electrical input signal is delivered to a plurality of electrically conductive interdigital transducer fingers 28, which by means of a piezo electric effect, generate an acoustic wave response on the active zone 24 according to the designed filter wavelength frequency selectivity. The filtered mechanical signal is picked up by the interdigital fingers 30 of the output transducer 22, and delivered to load 32. Generally, the wire leads of the source 26 and load 32 are connected to respective bus conductors 34, 36 at enlarged bond pads 38, 40. The fingers 28, 30 buses 34, 36 and pads 38, 40 are typically formed on the working surface monolithically 18 by any of a variety of well-known lithographic processes.

In FIG. 1, the oven is provided by a plurality of heater elements 42 on the outside surface of the casing 14. The heat must pass through the air space 16 where temperature gradients in the casing are reduced such that the hot air in contact with the lateral surfaces of the crystal 12 is of substantially uniform temperature. A source of power 44 is connected to the heating elements 42, and temperatures sensors 46 and associated controller 48 provide a control heater control signal 50 to the power source 44.

Figure 2:
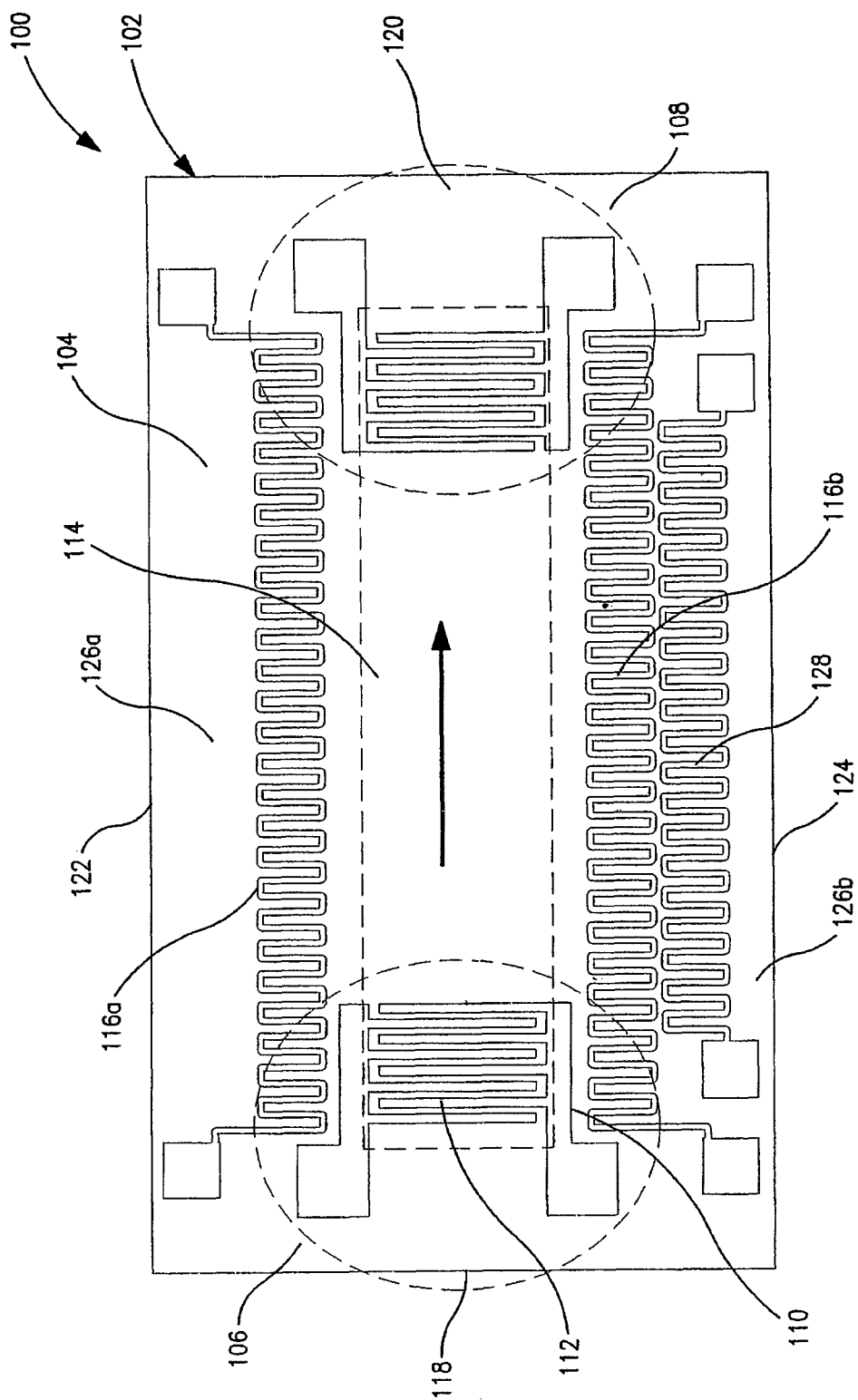
FIG. 2 is a schematic of the main operative portion of a SAW band pass filter with monolithic heating and sensing elements on the SAW substrate.

FIG. 2 shows one embodiment 100 a band pass filter of the type show in FIG. 1, with monolithic heating elements. The piezo electric crystal 102 has substantially the same working surface 104, input transducer 106, output transducer 108, buses (represented at 110), interdigital fingers (represented at 112) and active zone 114 (represented by a dashed rectangle) as described with respect to FIG. 1. The most significant difference is that the heating elements 116 A, B are provided on the working surface 104. In FIG. 2 (likewise FIG. 1) the working surface 104 is substantially rectilinear with opposite input and output ends 118, 120 and opposite sides 122,124. The transducers 106, 108 are adjacent the input and output ends 118, 120, with the active zone 114 situated between and including the transducers 106, 108. The heating elements 116A and 116B can be situated along side margins 126A and 126B of the working surface 104, between the active zone 114 and the sides 122, 124 of the working surface 104 of the substrate 102. Importantly, the heating elements 116 are in a much more intimate relationship with the active zone 114 than is possible with conventional ovens.

The temperature sensor 128 is likewise in a more intimate relationship with the active zone. In FIG. 2, the sensor 128 is on the side margin 126B of the working surface, between the heating element 116B and the side 124 of the working surface 104, but as will be described below, a plurality of sensor are preferably situated between the heating elements and the active zone.

The heating elements 116 are formed monolithically with at least the transducers 106, 108. The term "monolithic" when used herein should be understood as in the field of semiconductor technology, i.e., formed on a single crystal substrate. Multiple photolithographic steps can be used. The heaters, sensors, and resonator/filter pattern can be added to the substrate in a single photolithographic step (lowest cost). Multiple steps can be used if the required parameters (e.g., heater resistance) cannot be obtained in one step. This can still be considered monolithic. The invention can also be implemented with so-called "hybrid" features that are formed outside the substrate and then attached to the substrate.

Figure 3:
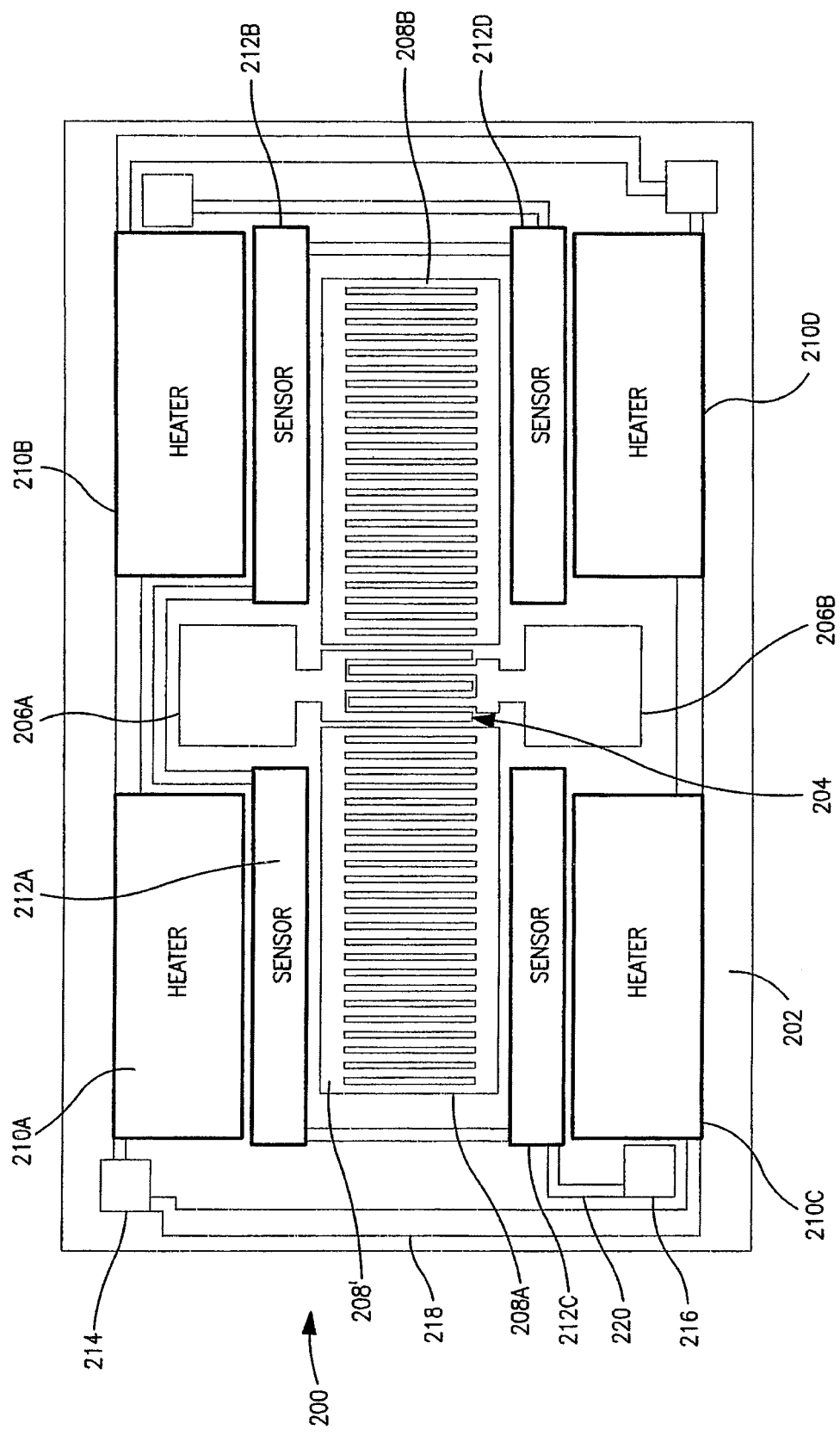
FIG. 3 is a schematic of the main operative portion of a one-port SAW resonator with monolithic heating elements and monolithic temperature sensor.

FIG. 3 is a schematic of the main operative portion of a one-port SAW resonator 200 with monolithic heater and temperature sensor. The substrate 202 has a central transducer 204 formed thereon, with alternating fingers, some of which are connected to bus 206A and the others connected to bus 206B. A first reflector grating 208A is situated on one side of the transducer 204, and another reflector grating 208B is situated on the other side of the transducer 204. A plurality of heaters 210A, B, C, and D, are on the working surface between the gratings 208A, 208B and the edges of the substrate. A plurality of temperature sensors 212 A, B, C, and D are located on the working surface, respectively between each heater 210 A, B, C, and D, and the boundary (such as 208') of each of the reflector gratings. At least one bond pad 214 is provided for the heaters, and at least one bond pad 216 is provided for the sensors. It should be appreciated that a bond pad can be shared, e.g., one sensor pad may be shared with one transducer bus. Conductive pads 218 between one or more heaters and conductive pads 220 between one or more sensors can be provided in a known manner.

The transducer 204, heaters 210, and sensors 212 and preferably the respective transducer buses 206, bond pads 214 for the heaters, and bond pads 216 for the sensors, are all monolithic with the substrate 202. The location of the heaters 214 on the substrate close to the grating 208 provides a substantially uniform temperature at the active zone, and the location of the sensors 212 on the substrate 212 immediately adjacent to the grating 208 provides a more accurate measure of the temperature in the active zone. Furthermore, a plurality of sensors with an associated plurality of heaters, coupled to a control system that compares the outputs of four sensors, can be used to adjust the current differential to each heater for achieving uniformity in the temperature of the active zone.

Figure 4:
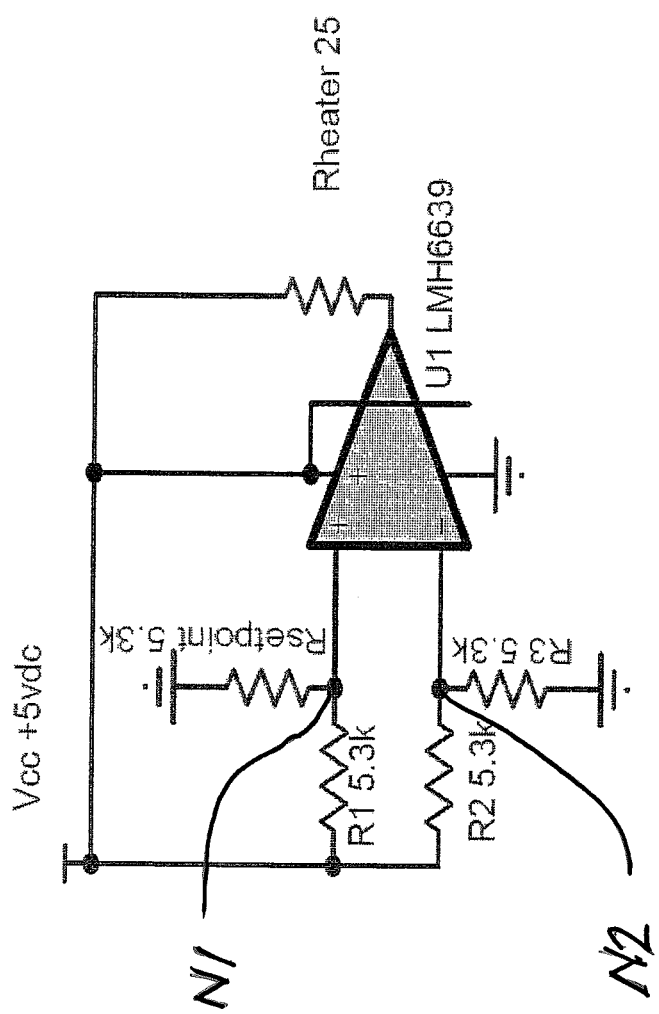
FIG. 4 is a circuit schematic for a controller and associated contacts according to the present invention, that can be used for a variety of SAW devices such as the resonator shown in FIG. 3.

According to one embodiment of the present invention, a temperature controller for a band pass filter such as shown in FIG. 2 or for a resonator such as shown in FIG. 3, can take the form of the schematic shown in FIG. 4, for improving the thermal efficiency of the micro-oven, by dissipating much of the heat associated with the resistors and controller amplifier, to the substrate rather than losing the heat through wire bonds to external components. The controller is carried on the SAW substrate.

Resistors R1, R2, and R3 may be considered as the temperature sensing elements, whereas resistor RS is a set point resistor which is preferably adjustable by the end user. The resistor R1 and set point resistor RS form a first voltage divider and resistors R2 and R3 form a second voltage divider. Resistors R1 and R2 are connected at common node N1 that is maintained with a bias voltage from an exterior source Vcc. The plus (+) terminal of the operational amplifier U1 is connected to the common node N2 of R1 and RS. Similarly, the input to the minus (−) terminal of the operational amplifier is connected to the common node N3 of R2 and R3. Whenever a voltage difference is present between the plus (+) and minus (−) terminals of the operational amplifier, a net voltage commensurate with that difference is applied to the variable heating resistor RH. Heating resistor RH is arranged in a feedback loop from the output of the amplifier U1 to the source voltage node Vcc. In a conventional manner, the amplifier is powered by an input connection to the voltage source node Vcc and is connected to ground. The resistor R3 and the set point resistor RS are also connected to ground. It should be appreciated that R1, R2, and RH are on the SAW mask, and the operational amplifier U1 is epoxy bonded to the SAW substrate.

The operational effect of this circuit relies on the nominal values of all the resistors being equal, so the midpoint of each voltage divider should have an equivalent voltage. The midpoints of these voltage dividers are connected to the inverting and non-inverting inputs of the operational amplifier U1. However, R1, R2 and R3 are temperature variable and arranged on the substrate but RS is temperature invariable and/or arranged remote from the substrate. Since equivalent resistors R2 and R3 are positioned on the substrate, the midpoint of this voltage divider will not vary with the temperature of the substrate. The midpoint of the voltage divider R1 and RS will vary with the temperature of the substrate, since R1 is temperature variant and positioned on the substrate. As the temperature of the substrate changes, the inputs to the operational amplifier will change in a corresponding manner, causing feedback through RH to adjust the temperature of the substrate until the inputs to the operational amplifier balance again. RS is preferably adjustable, which permits the user to set the target temperature the controller will maintain on the substrate.

In this embodiment, the three connections to the SAW substrate are VCC, ground, and RS (where it connects to R1, if RS is not positioned on the substrate). If one seeks to minimize connections to the substrate, only one ground connection should be used. Ground can be common to all those components, so only one ground connection to the chip is needed. It can be appreciated that from a hardware perspective, the only wire bonds that extend from the substrate are for the voltage source node Vcc, a common ground connection for resistor R3 and the amplifier U1, and a ground for the set point resistor RS. The set point resistor RS can itself be off the substrate and adjustable by the user.

Figure 5:
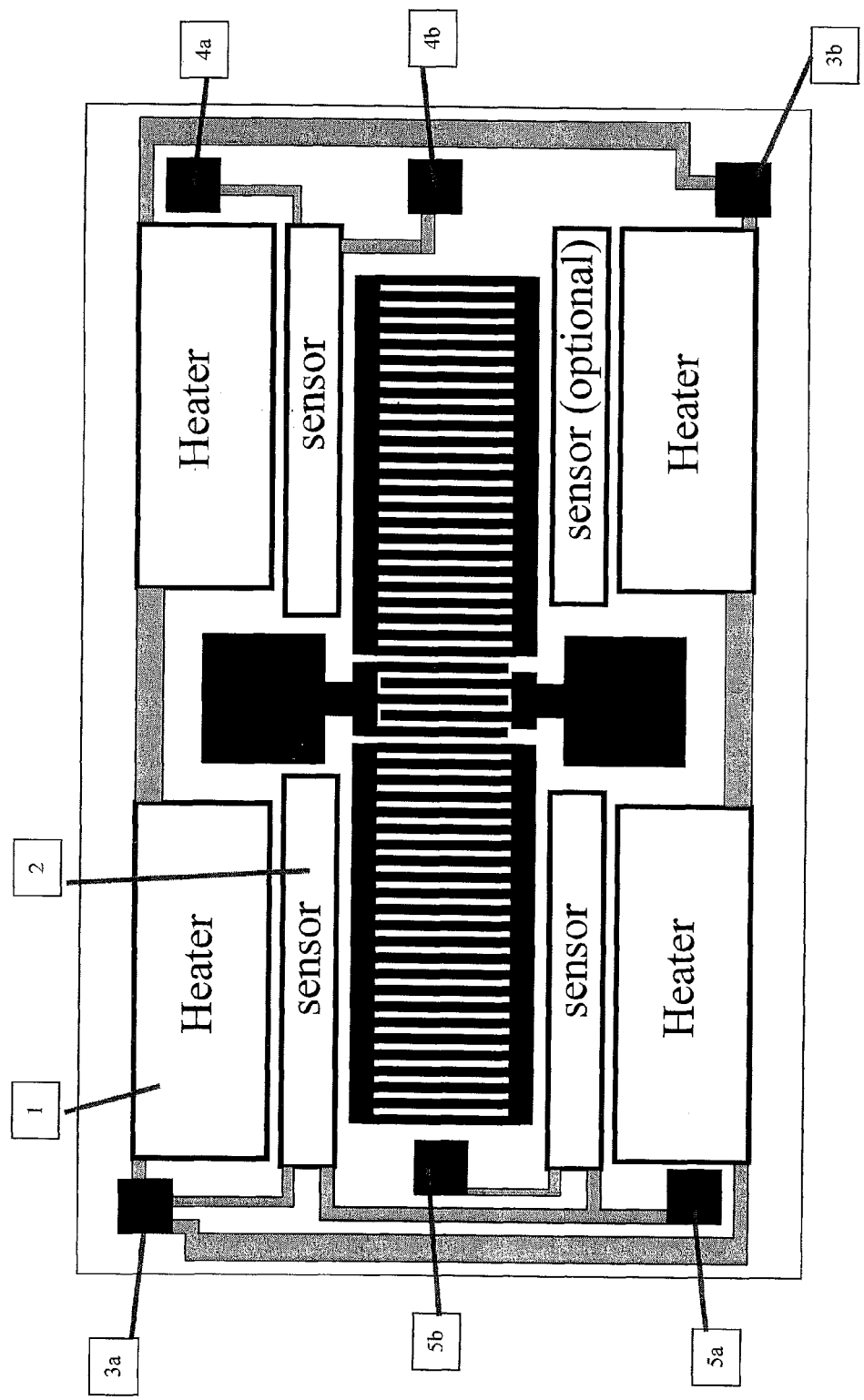
FIG. 5 is a schematic of a one-port SAW resonator with bond pad configuration that reduces heat loss in accordance with the present invention.
Figure 6:
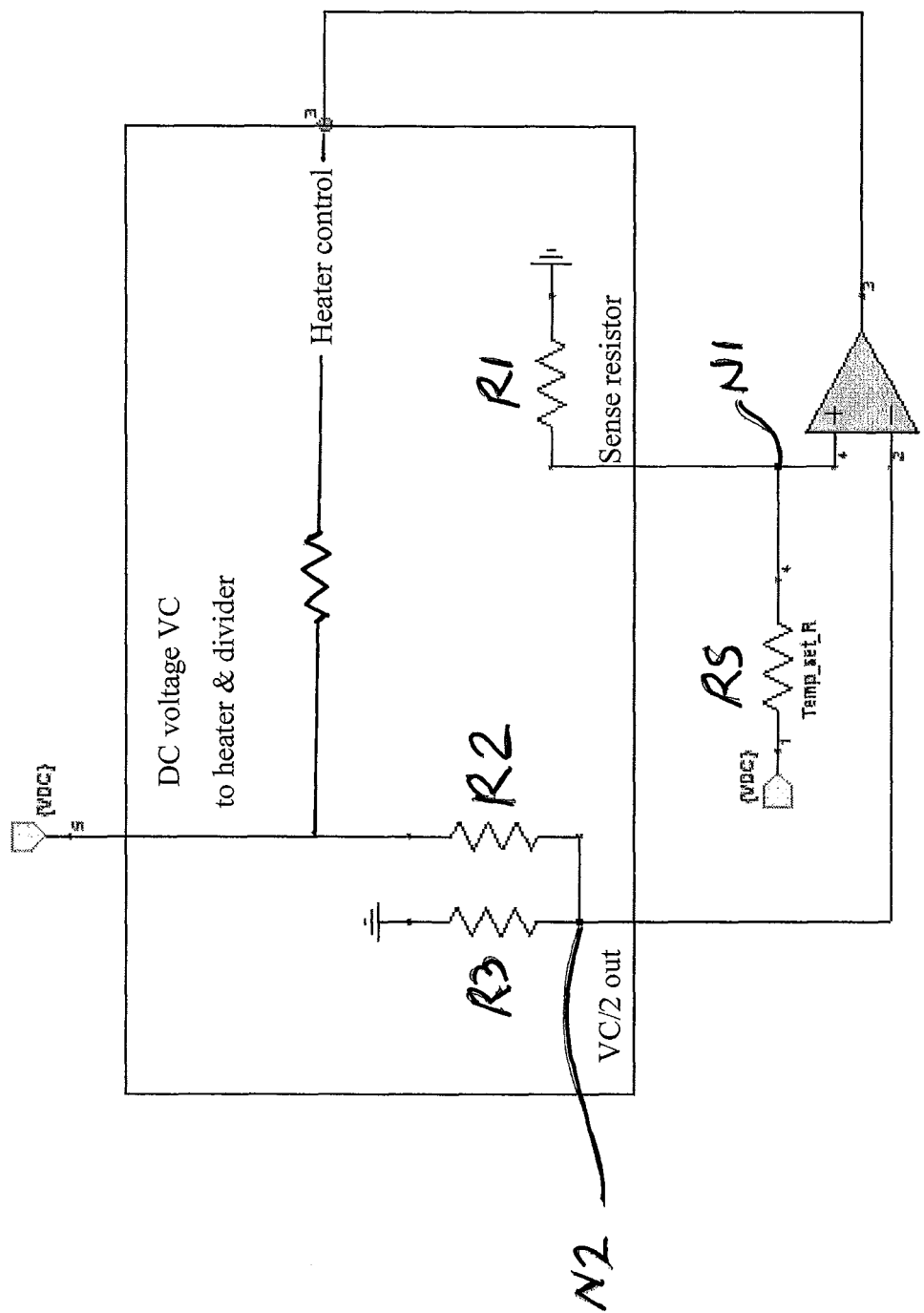
FIG. 6 is a circuit schematic for an alternative controller, for the resonator of FIG. 5.

FIGS. 5 and 6 show a one port SAW resonator and alternative temperature controller, labeled to show a direct correspondence of the electrical connections. The heater element 1 and temperature sensor 2 are deposited on the substrate surface. The bond pads for the heater elements are shown as 3a for the voltage and 3b for the return (heater control output line of the operational amplifier). The bond pads for the temperature sensor element (resistor component) are shown at 4a for the voltage tap and 4b for ground. The bond pads for the sensor voltage divider are shown at 5a for the voltage and 5b for ground.

It can this be seen that only three electrical connections at voltage are needed on the substrate (3a, 4a, and 5a) to off-SAW die points, for providing the function of temperature control.

The controller circuits shown in FIGS. 4 and 6 are equivalent. In FIG. 4, (i) the first, temperature dependent resistor R1 is connected at its output end to input node N1; (ii) the second, temperature invariant set point resistor RS is connected at its input end to the node N1 and to ground; (iii) the third, temperature dependent resistor R2 is connected at its output end to the other input node N2; and (iv) the fourth, temperature dependent resistor R3 is connected at its input end to the other node N2 and ground. In FIG. 6, (i) the first, temperature dependent resistor R1 is connected at its input end to input node N1 and to ground; (ii) the second, temperature invariant set point resistor RS is connected at its output end to node N1; (iii) the third, temperature dependent resistor R2 is connected at its output end to the other input node N2; and (iv) the fourth, temperature dependent resistor R3 is connected at its input end to the other node N2 and to ground.

The invention claimed is:

1. A temperature controller for a SAW device, comprising:
a SAW device arranged on a piezoelectric crystal substrate;
a heating element on said piezoelectric crystal substrate;
a temperature sensor on said piezoelectric crystal substrate, said temperature sensor including first, second and third temperature variable resistors on said piezoelectric crystal substrate;
a first voltage divider comprising said first temperature variable resistor and a temperature invariant set point resistor connected in series between an input voltage and ground, said first temperature variable resistor and said temperature invariant set point resistor connected at a first node;
a second voltage divider comprising said second and third temperature variable resistors connected in series between said input voltage and ground, said second and third temperature variable resistors connected at a second node; and
an operational amplifier having first and second input nodes connected to said first and second nodes, said operational amplifier configured to zero a voltage across said first and second input nodes by controlling the voltage across the heating element,
wherein electrical connections with said piezoelectric crystal substrate for the purpose of temperature control consist essentially of three electrical connections.

2. The temperature controller of claim 1, wherein the temperature variable resistors are meander resistors carried on the piezoelectric crystal substrate.

3. The temperature controller of claim 1, wherein the operational amplifier is bonded to the piezoelectric crystal substrate.

4. The temperature controller of claim 1, wherein the first and second voltage dividers and the operational amplifier are grounded to the same point of the piezoelectric crystal substrate.

5. The temperature controller of claim 1, wherein the heating element is a meander resistor adhered to the piezoelectric crystal substrate.

6. The temperature controller of claim 1, wherein said first and second voltage dividers are connected to a source voltage node and the heating element is connected between the source voltage node and an output of the operational amplifier.

7. The temperature controller of claim 1, wherein said voltage dividers and the operational amplifier are connected to a common ground terminal that is off the substrate.

8. The temperature controller of claim 6, wherein the source voltage node is connected to a voltage source that is off the substrate.

9. The temperature controller for a SAW device of claim 1, wherein said three electrical connections are source voltage for the voltage dividers, operational amplifier and heater, ground for said second voltage divider and operational amplifier, and a connection between said temperature invariant set point resistor and said first node.

10. A surface acoustic wave (SAW) device comprising:
a piezoelectric crystal substrate;
a working surface of the substrate capable of transmitting acoustic waves along an acoustic channel;
at least one transducer formed on said working surface for inducing said waves to travel along said channel and for receiving said waves;
at least one heating element formed on the substrate;
at least one temperature sensor having an output which varies with a temperature of said substrate, said temperature sensor including a first electric component formed on said substrate whose resistance varies with the temperature of said substrate and a second electric component whose resistance does not vary;
a temperature controller including an operational amplifier bonded in thermally conductive relationship to the substrate, said operational amplifier responsive to the output of said temperature sensor to apply power to said heating element to maintain the temperature of said substrate within a predetermined temperature range;
wherein the transducer, heating element, and first component are monolithically formed on the substrate; and
only three electrical connections with the piezoelectric crystal substrate are needed to control the temperature of the piezoelectric crystal substrate.

11. The SAW device of claim 10, wherein the temperature sensor comprises a voltage divider bridge having bridge output nodes and the controller comprises
a servo loop between the temperature sensor and the heating element, which servo loop strives to zero the bridge voltage across said two nodes which are also two input nodes of the operational amplifier by controlling the voltage across the heating element, wherein one leg of the bridge has a first, temperature dependent resistor constituting said first component connected to one input node and a second, temperature invariant set point resistor constituting said second component connected said one node;

wherein the other leg of the bridge has a third, temperature dependent resistor connected to the other input node and a fourth, temperature dependent resistor connected to the other node.

12. The SAW device of claim 11, wherein said three electrical connections include source voltage for both legs of the bridge, operational amplifier and heater, ground for one leg of the bridge and operational amplifier, and a connection between said temperature invariant set point resistor and one node of said operational amplifier.

13. The temperature controller of claim 11, wherein both legs of the bridge and the heating element are connected to a common source voltage node on the substrate.

14. The temperature controller of claim 11, wherein one leg of the bridge and a ground lead from the amplifier are connected to a common ground terminal that is off the substrate.

15. The temperature controller of claim 13, wherein the source voltage node is connected to a voltage source that is off the substrate.

* * * * *